(12) United States Patent
Tripathi et al.

(10) Patent No.: US 6,700,455 B2
(45) Date of Patent: Mar. 2, 2004

(54) ELECTROMAGNETIC EMISSION REDUCTION TECHNIQUE FOR SHIELDED CONNECTORS

(75) Inventors: Alok Tripathi, Beaverton, OR (US); Dennis J. Miller, Sherwood, OR (US)

(73) Assignee: Intel Corporation, Santa Clara, CA (US)

( * ) Notice: Subject to any disclaimer, the term of this patent is extended or adjusted under 35 U.S.C. 154(b) by 12 days.

(21) Appl. No.: 09/940,147

(22) Filed: Aug. 23, 2001

(65) Prior Publication Data

US 2003/0038686 A1 Feb. 27, 2003

(51) Int. Cl.[7] .............................. H03H 7/01; H01R 9/09
(52) U.S. Cl. ..................... 333/12; 333/181; 439/610; 439/947
(58) Field of Search .................... 333/12, 181; 439/947, 439/941, 620, 610

(56) References Cited

U.S. PATENT DOCUMENTS

| | | | | |
|---|---|---|---|---|
| 4,827,378 A | * | 5/1989 | Gillan et al. ............. | 333/12 X |
| 5,351,018 A | * | 9/1994 | Lehmann et al. ............. | 333/12 |
| 5,470,238 A | * | 11/1995 | Walden .................. | 439/497 X |
| 5,562,498 A | | 10/1996 | Brandenburg et al. ...... | 439/620 |
| 5,926,377 A | * | 7/1999 | Nakao et al. ............. | 333/12 X |
| 6,023,202 A | * | 2/2000 | Hill ........................ | 333/12 X |
| 6,033,263 A | | 3/2000 | Weidler et al. ............. | 439/620 |
| 6,052,038 A | * | 4/2000 | Savicki ..................... | 333/12 |
| 6,353,540 B1 | * | 3/2002 | Akiba et al. ............. | 333/12 X |

FOREIGN PATENT DOCUMENTS

DE 9016083 2/1991

* cited by examiner

*Primary Examiner*—Barbara Summons
(74) *Attorney, Agent, or Firm*—Blakely, Sokoloff, Taylor & Zafman LLP

(57) ABSTRACT

A method and apparatus for reducing electromagnetic emissions from a high-speed differential data connector is disclosed. The method and apparatus are as effective as a 360° enclosure, while being easier and less expensive to manufacture and does not require a direct electrical connection between the Transistor-to-Transistor logic (TTL) or logic ground and the system chassis ground.

17 Claims, 11 Drawing Sheets

ELECTROMAGNETIC EMISSION REDUCTION TECHNIQUE FOR SHIELDED CONNECTORS

FIELD

This invention relates to high-speed differential serial link cable connectors. More specifically, this invention relates to suppression of common electrical noise on the cable braid for the reduction of electromagnetic emissions using technique applicable to the printed circuit board (PCB) on which this cable connector is mounted.

BACKGROUND

The operation of high-speed serial data connectors between peripheral devices, for example, a server or a desktop computer transmits data at high speeds between various peripheral/system devices. Other examples of such a high-speed serial differential connector usage includes connecting two peripheral devices through a high-speed serial differential connection. These peripheral devices can be, but are not limited to, a memory box or a redundant array of independent disks (RAID) controller. The cable connector in high-speed serial applications requires special shielding enclosures to isolate board-level noise from the external environment.

In general, the high-speed serial differential connector (HSSDC) metallic enclosure is connected to the chassis and the outer braid of the double shield (e.g. skew clear) cable. For safety reasons, the Transistor-to-Transistor Logic (TTL) or Logic ground is not connected directly to chassis ground. One such safety reason is that when two system/devices separated by a sufficient distance can have ground at different potential, a sizeable amount of current can flow along the cable from the one chassis to the second chassis. The potential difference can be very large and the cable provides a low impedance path, and hence large current on the cable shield. In such case, if the chassis is connected to the logic grounds of two systems, through the connector shell to the shell of another device which is at a different ground state/potential, the logic circuit at the low and high-potential ends may be burned out. In such a configuration, the two ends of the cables may have a voltage potential difference, particularly if each end of the cable attaches to a peripheral device that is at a different local ground potential. As a general practice, a high value resistance between the connector enclosure/chassis (connected to the local chassis ground) and the logic ground is recommended to provide a direct current (DC) path for the electrical current. This resistance provides a low current DC path for any voltage potential difference between the two ends of the cables.

For high-frequency data transfer applications, typically leaving the connector outer shell floating with respect to the logic ground allows a large amount of high-frequency surface currents on the connector shell. The surface current can get transferred to the outer braid of the cable and radiate. Providing a complete metallic closure of all the slots between the outer shell of the connector to the bracket, for example a peripheral component interconnect (PCI) bracket, for the chassis can significantly reduce the amount of common-mode current transferred to the outer braid of the cable. This technique of electromagnetic emission reduction is typically difficult to implement from a cost perspective in a large volume-manufacturing environment.

Another commonly used board level implementation technique to deal with the suppression of common mode noise (CMN) of the system on cable connectors (and hence the cable braid) is usage of an isolation transformer. The isolation transformer is connected in series with the differential signal lines of the cable and mounted on the PCB board near the ends of the cable connectors that connect to the peripheral devices. Isolation transformers reject/block common mode noise, and only allow the differential mode signal to pass into the differential signal pairs of the cable connector assembly. During this process the isolation transformer also attenuates the differential signal, which is not a severe problem for low data rate transfer applications. However as the frequency of signal increases, the isolation transformers degrade signal characteristics such as rise time and levels. At high frequencies, due to electrical parasitics, the isolation transformers have severe frequency-dependent attenuation characteristics and hence lead to the severe deterioration of differential signal quality due to intersymbol interference (ISI). In general, the isolation transformer is adequate to reduce the electromagnetic interference around 200–300 MHz but has limited applications above one GHz.

BRIEF DESCRIPTION OF THE DRAWINGS

The invention is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

DETAILED DESCRIPTION

Reference will now be made to drawings wherein like structures will be provided with the like reference designations. In order to show the structures of the claims more clearly, the drawings included herein are diagrammatic representations of integrated circuit structures. Thus, the actual appearance of the fabricated structures, for example in a photomicrograph, may appear different while still incorporating essential structures of the claims. Moreover, the drawings show only the structures necessary to understand the claims. Additional structures known in the art have not been included to maintain the clarity of the drawings.

Figure 1:
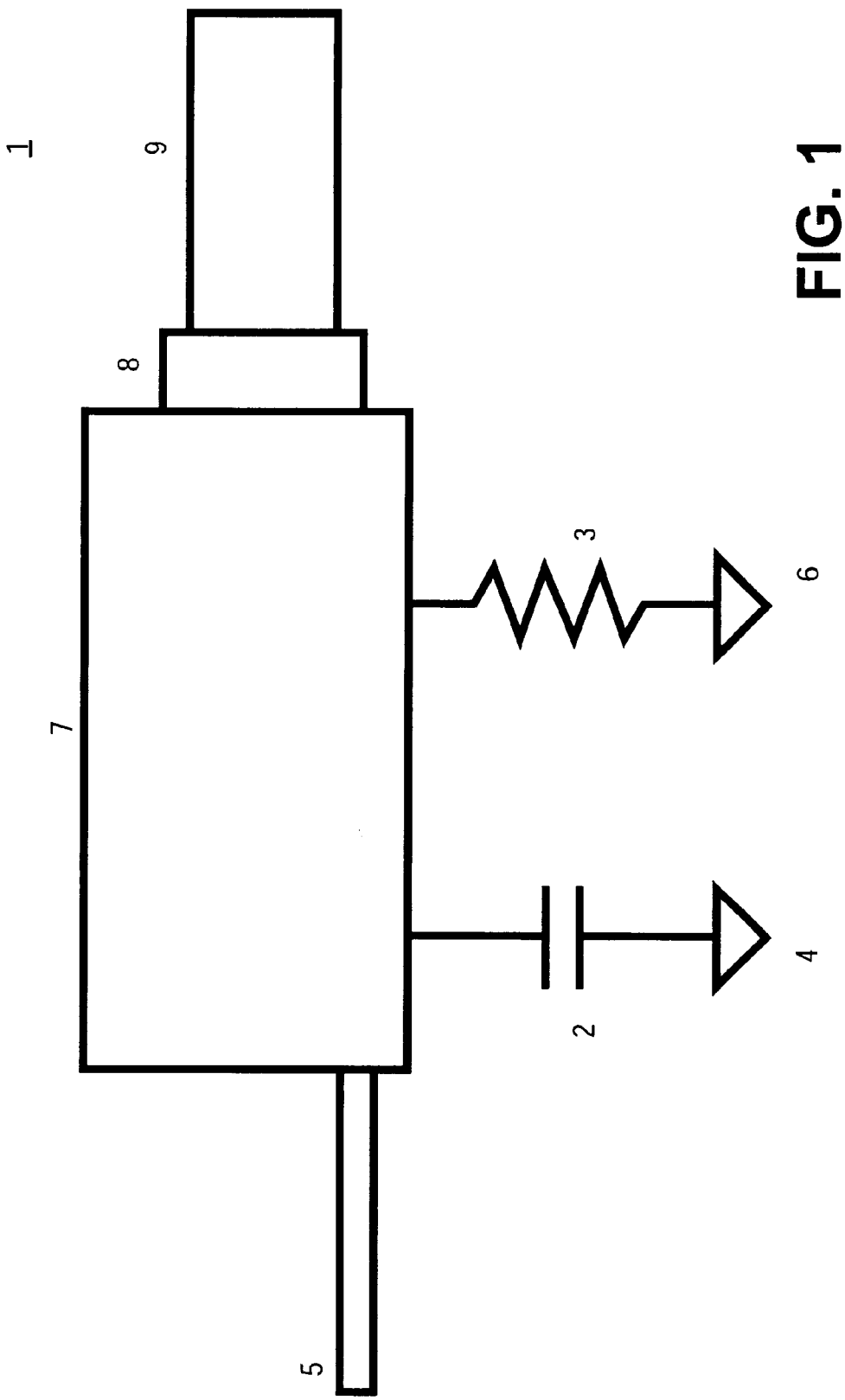
FIG. 1 is a schematic illustration of one embodiment of an assembly of a cable coupled to a high speed data signal line through a connector.

FIG. 1 is a schematic representation of one embodiment of a coupling assembly for coupling a cable (e.g. a high speed data cable) to a printed circuit board (PCB). Assembly 1 includes cable 9, which is a high-speed serial data connector. The signal travelling through cable 9 may have a frequency up to and beyond one gigahertz (GHz). The signal travelling through cable 9 can be carrying along with it, through the cable's outer shell (braid), common mode noise (CMN) generated from the system. This common mode noise, if not provided for, can radiate from the cable or the outer shell of the cable connector and generate electromagnetic emissions. Cable 9 attaches to a printed circuit board at the input of, for example, a peripheral device, through cable receptor 8. Cable receptor 8 makes the electroconnection between the data signal line in cable 9 and the high-speed differential signal on line 5, on for example a printed circuit board. Connector shell 7 covers the area in which cable receptor 8 transitions the signal from Cable 9 to high-speed differential signal line 5. Connector shell 7 typically will have a poor electrical connection (or highly resistive connection) 3 to a faceplate bracket or chassis ground 6 of the plug-in card (e.g. PCI card) in question. High impedance connection 3, which models the poor electrical contacts, connects the connector shell to the faceplate bracket, and then to chassis ground 6. Bypass capacitor 2 is the bypass capacitor implemented using the printed circuit board (PCB) inter-planar capacitance. Assembly 1 also includes bypass capacitor 2, which provides low impedance high frequency alternating current connection to logic ground 4 reducing the electromagnetic emission for a high-speed connector.

Figure 2:
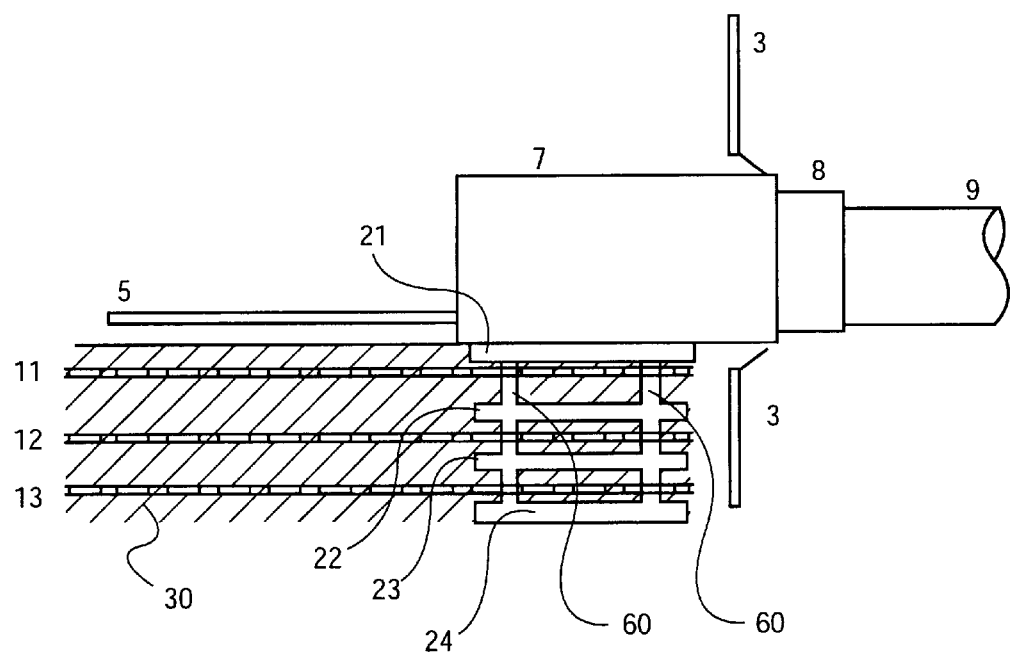
FIG. 2 is a cross-sectional schematic illustration of the assembly coupled to a printed circuit board.

FIG. 2 is a schematic cross-sectional illustration of one embodiment of an implementation of the proposed technique of reducing the electromagnetic emission interference of high-speed connectors showing the signal layer metallizations and the logic ground planes. Cable 9 transmits high-speed differential signals into cable receptor 8 and then to high-speed differential signal line 5 within connector shell 7. Connector shell 7 rests on the printed circuit board. The high impedance connection of connector shell to face plate bracket 3 secures the cable receptor, connector shell and printed circuit board to the chassis of the peripheral device or system. An inter-plane capacitor is made to use logic ground of the printed circuit board as a ground for high-frequency alternating current common mode noise.

A printed circuit board typically comprises multiple signal, power and ground layers separated from one another by a dielectric material. One such dielectric may be but is not limited to FR4. FR4 is available as printed circuit board from Polyclad Laminates Inc. of Franklin, N.H. FR4 is a combination of polymer and glass that responds predictably when manufactured into a printed circuit board. FR4 is a dielectric and so electrically isolates metal layers between which it is interspersed. A printed circuit board typically has several metallization layers in it. It can have fewer layers or more layers then shown in the FIG. 2. The printed circuit board may be a collection of signal, power and ground lines/planes that are interspersed in a pattern such as ground, signal, power, ground and then maybe this progression will repeat.

In one embodiment of a printed circuit board, the top layer could be a signal layer. A signal layer is used to transmit high-speed differential signals throughout the board. The signal layer will resemble ribbons on the printed circuit board if seen from above. Individual signal lines or traces will not touch each other except to make electrical contact. In one embodiment it is on the signal layer that the direct connection to the capacitor pad will be made from the connector shell. The portion of the signal layer that is dedicated to the capacitor pad will be isolated from other signal lines on the signal layer. A layer of dielectric will be spread between signal metal layers and logic ground layers on either side of the layers to electrically isolate them from one another. The dielectric layer between the signal and logic-ground will act as the high capacitance material in forming the interplane capacitors.

In FIG. 2, the capacitor plates made on signal layers are numbered 21, 22, 23, and 24. In this example, there are four signal layers in the printed circuit board. There may be more or there may be fewer in other examples. Logic ground planes 11, 12, and 13 do not make direct connection to the signal layer metallizations 21, 22, 23, and 24. Instead they make capacitor electrodes on the opposite side of the capacitor material from the signal layer capacitor electrodes. Logic ground layers 11, 12, and 13 may cover the entire area of the printed circuit board at their level. Each of logic ground layers 11, 12, and 13 provide a return path for power that has been supplied to logic functional units installed on the printed circuit board. Logic ground layers 11, 12, and 13 are isolated from signal and power layers by a dielectric 30, in one example FR4. Connector pins 60 as seen in FIG. 2 make direct connection from the connector shell to the capacitor metallizations on signal layer levels 21, 22, 23, and 24.

Figure 3:
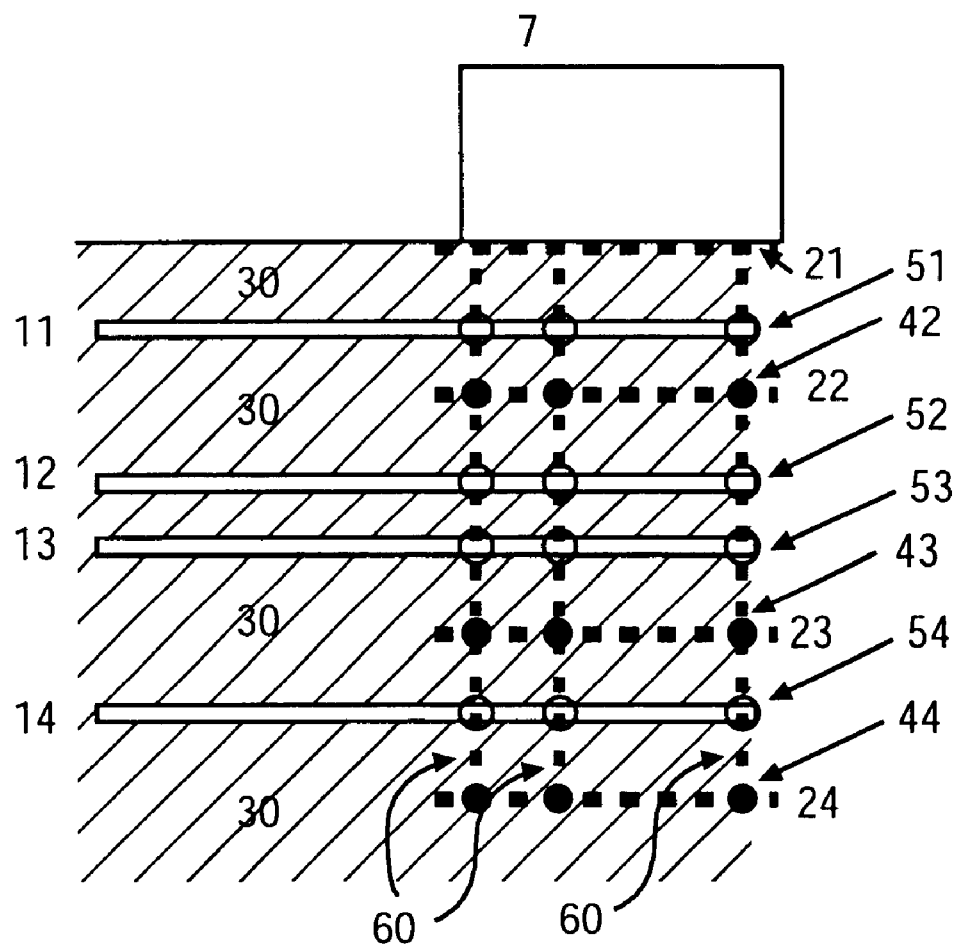
FIG. 3 is a detailed cross-sectional schematic illustration of an embodiment of an interplane bypass capacitor shown in FIG. 2.

FIG. 3 is a magnified cross-sectional schematic side view illustration of a portion of the assembly shown in FIG. 2. Connector outer shell 7 is seen connected to top signal layer metallization 21 of the printed circuit board. In this example, signal layer metallization 21 shares a similar footprint of connector outer shell 7 and is the top layer in the printed circuit board. Signal layer metallization need not be the closest metallization layer to the connector shell and need not share the footprint of the connector shell. Signal layer 21 could be, for an example, the second layer down from the connector shell. Signal layer 21 can be the footprint of connector shell 7 or it can be smaller than the footprint of connector shell 7 or larger depending, in one aspect, on the capacitance required in the technique.

The PCB comprises multiple signal layers, here numbered 21, 22, 23 and 24. In one embodiment, signal layer 21 is the closest signal layer to connector shell 7. In this embodiment, signal layer 22 is the next closest signal layer to connector shell 7. Connector pins 60 make a direct connection to all these signal layer metallizations 21, 22, 23 and 24. Connector pins 60 pass through logic ground metal layers without making an electrical connection to the logic ground. First signal layer metallization 21 is isolated by dielectric material 30. Under the dielectric material is a logic ground layer 11. The connector pins 60 connecting the connector outer shell to the various signal layer metallizations passes through multiple vias 51 through logic ground layer 11 and onto signal layer metallization 22 without making an electrical connection to logic ground 11. Connector pins 60 make direct electrical contact to signal layer metallization 22 through connections 42 and with connector shell 7. This process is repeated through dielectric material 30 until sufficient signal layer metallizations are directly connected by connector pins 60 to generate sufficient capacitance to provide a high-frequency low-impedance alternating current path from the connector outer shell 7 to logic grounds 11, 12, 13, and 14.

Figure 4:
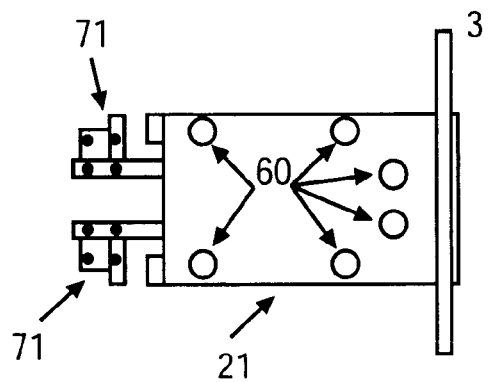
FIG. 4 is a schematic top view of the top layer capacitor plate on the printed circuit board.

FIG. 4 is a schematic top view illustration of top signal layer metallization 21. In this illustration, the high-impedance connection 3 of the connector shell to a faceplate bracket can be seen. In addition to the interplate capacitors of the printed circuit board forming a low-impedance high frequency alternating current path to logic ground, there may be discrete capacitors on the top layer of the printed circuit board to also make low-impedance connections to logic ground. These discrete capacitors 71 may be used to generate capacitance for low-frequency common mode noise, for example, in a range of 200–300 MHz. Inexpensive discrete capacitors are not capable by themselves of providing a low-impedance high frequency path for common mode noise in the range of about a GHz. The interplane capacitors made from signal layer metallizations 21, 22, 23, and 24 combined with dielectric material 30 and logic ground layers 11, 12 and 13 are capable of handling common mode noise in the GHz range but may not be adequate in the 200–300 MHz range. Adding additional discrete capacitors 71 to the top layer of the print circuit board that connect to the logic ground along with the interplane capacitors 21, 22, 23 and 24 provide common mode noise electromagnetic emission reduction through the range of frequencies of 200 to over 1,000 MHz.

Figure 5:
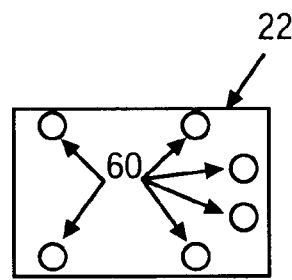
FIG. 5 is a schematic top view illustration of an interior capacitor plate.

FIG. 5 shows an interior signal layer metallization in a printed circuit board. In this figure the metallization layer is labeled 22; it could well be 23 in this embodiment, or 24 or higher in an embodiment that had more than 4 layers of signal layer metallization. FIG. 5 shows where connector pins 60 make an electrical contact from connector shell 7 in FIG. 3, to signal layer metallization, in this FIG. 22.

Figure 6:
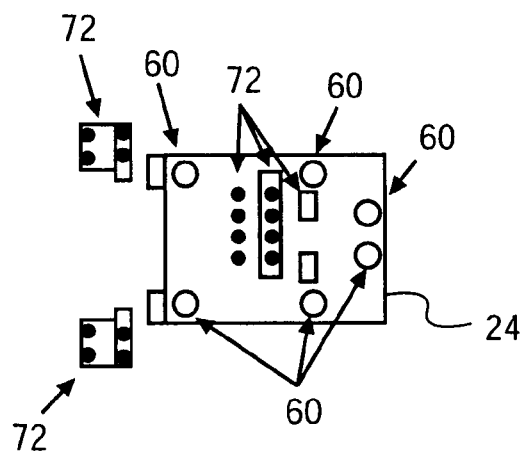
FIG. 6 is a top view schematic illustration of a bottom layer capacitor plate.

FIG. 6 shows the bottom signal layer metallization of one embodiment of the proposed technique. Providing the bottom signal layer is the bottom layer of the printed circuit board, additional discrete capacitors 72 may be placed on the bottom metal layer, in this embodiment, 24. As in the example of the top layer these discrete capacitors can assist in the common mode noise electromagnetic interference reduction in the hundreds of MHz range.

Figure 7:
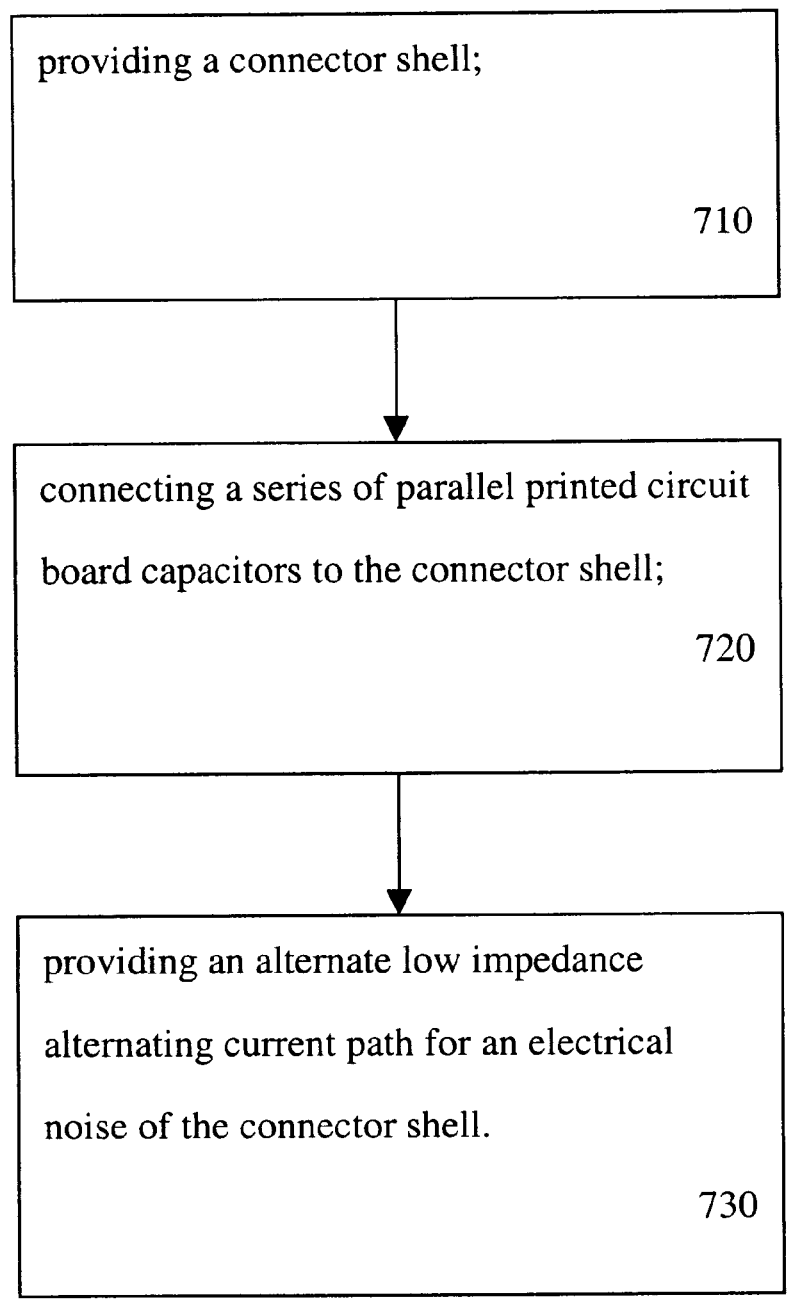
FIG. 7 is a flow diagram representing one method of fabricating one embodiment of the electromagnetic emission reduction technique.

FIG. 7 is a flow diagram representing one method of fabricating one embodiment of the electromagnetic emission reducer for high-speed connectors. A connector shell is provided in block 710. This connector shell typically houses the cable receptor that allows the high-speed differential signal to make a transition from a high-speed serial data connector cable to the high-speed differential signal line for the printed circuit board. Connecting a series of parallel circuit board capacitors near the connector shell is shown in block 720. By connecting multiple signal layer capacitor plates through connector pins to multiple logic grounds, a parallel capacitor implementation is achieved. The parallel capacitor plates add their capacitance to one another in forming the capacitance of the implementation. The capacitance of the individual plates, sums linearly to create a higher capacitance. This higher capacitance is able to provide a low impedance alternating current pathway for the common mode noise. The alternate low-impedance alternating current path for the electrical noise of the connector shell is provided in block 730.

Figure 8:
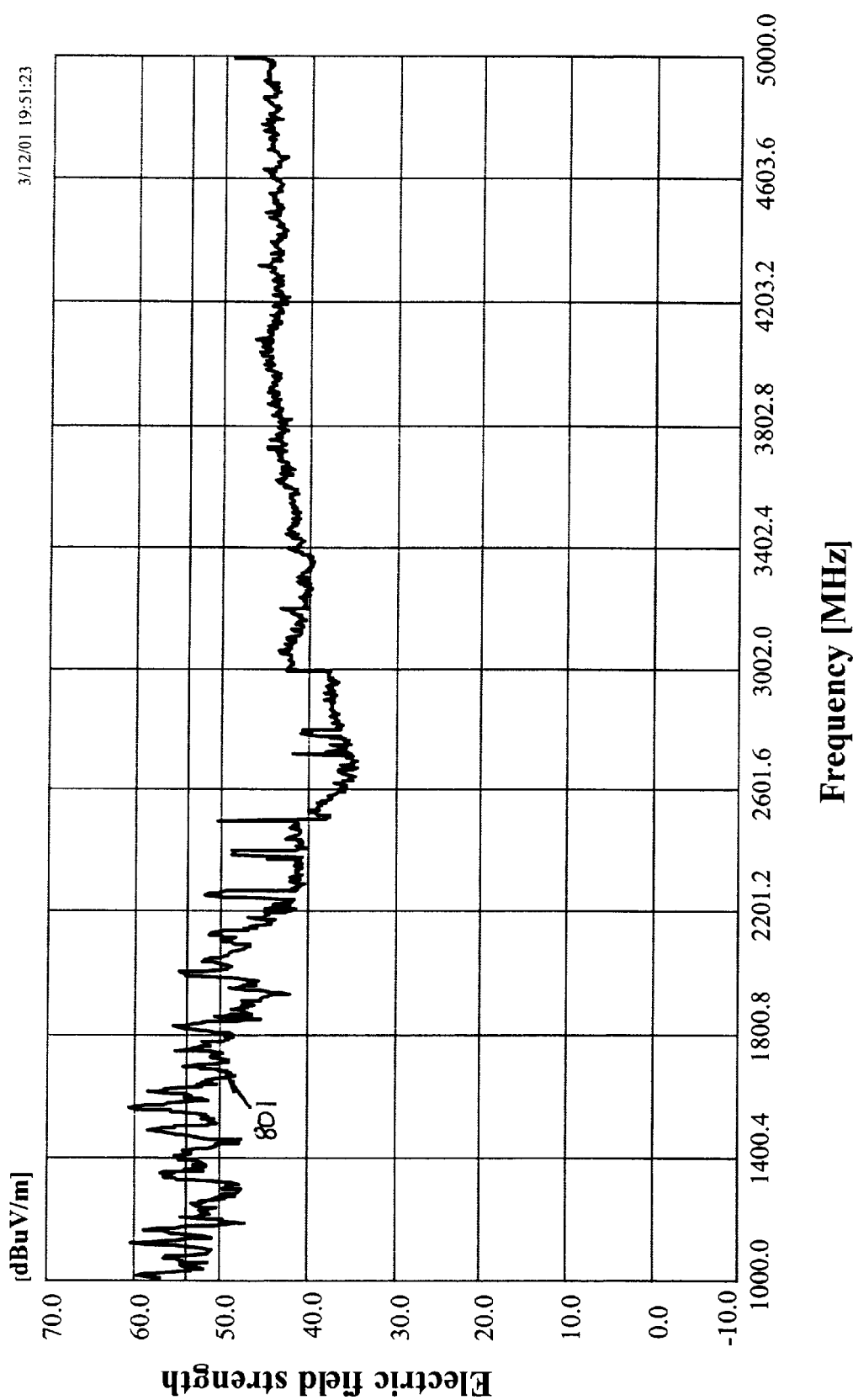
FIG. 8 is an electromagnetic interference scan showing a connector shell floating.

FIG. 8 is an electromagnetic interference (EMI) measurement performed in a three-meter anechoic chamber for 2.5 Giga-bit/second (2.5 Gb/s) data transfer application. This measurement shows the electromagnetic radiation in the frequency range 1,000 to 5,000 MHz (or 1 to 5 GHz). The important part of this measurement in this example is in the range of 1,000 to 2,500 MHz, where a significant portion of all the spectral energy of the signal for 2.5 Gb/s data transfer application exists. This is the major range over which the high-speed serial data connector will emit common mode noise. Above about 2,500 MHz, the HSCCD contributes little noise, and the EMI measured is from the background. Line 801 in FIG. 8 is a representation of the electromagnetic interference that would be generated by leaving the connector shell floating. That is, the connector shell is placed over the cable receptor but not connected to any ground therefore allowing a maximum amount of electromagnetic interference to radiate from the connector shell. The values of electromagnetic radiation can be seen to range from about 55 decibels at approximately 1 GHz to about 40 decibels at approximately 2.5 GHz.

Figure 9:
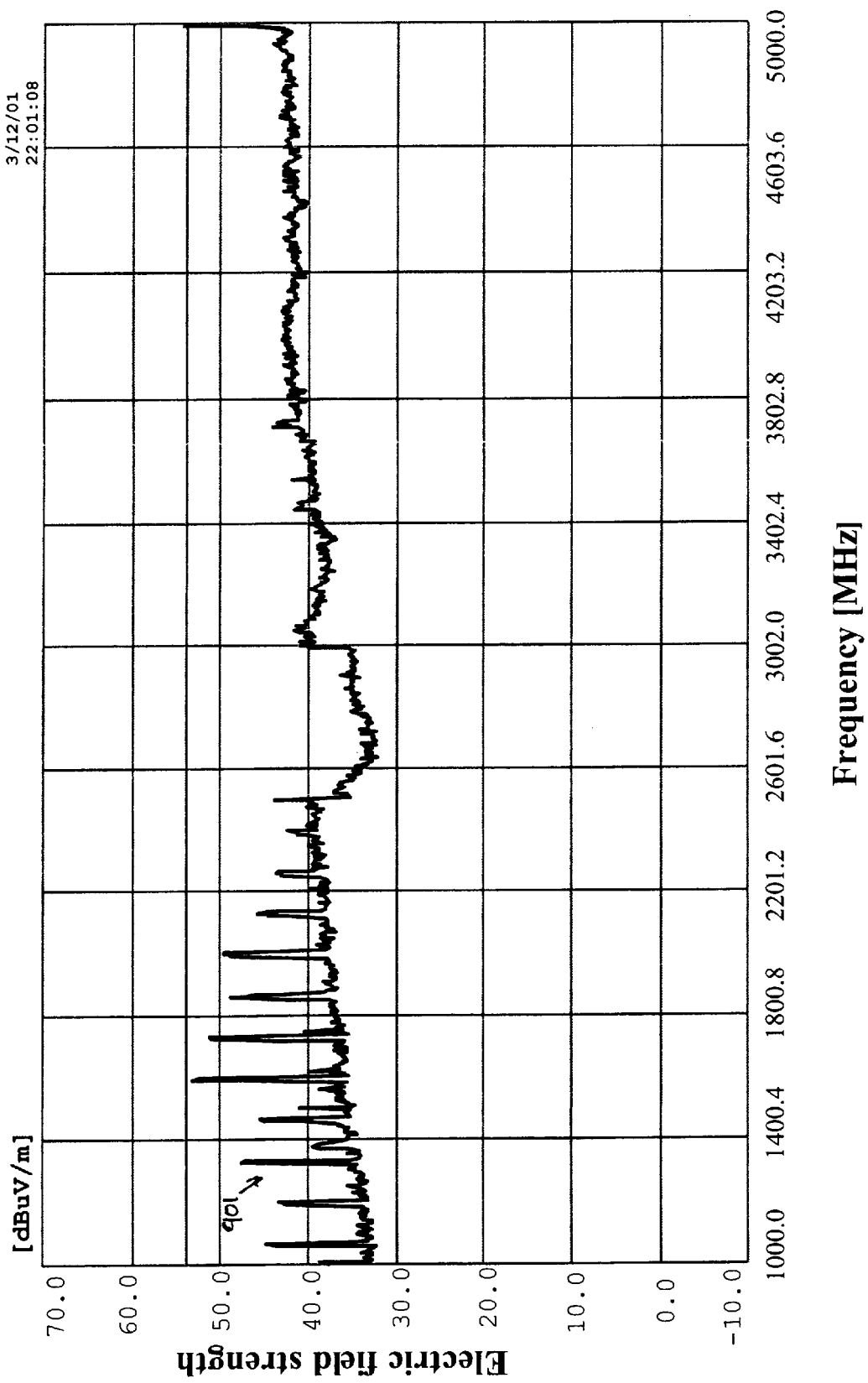
FIG. 9 is an electromagnetic interference scan showing the proposed bypass capacitor implementation.

FIG. 9 is an electromagnetic interference spectrum for a PCI board in a system with one embodiment of the proposed bypass capacitor implementation. The same technique was used to make this measurement as was used to make the measurement shown in FIG. 8. Line 901 in this figure shows electric field strength of about 33 decibels at approximately one GHz that gradually goes up to about 39 decibels at approximately 2.5 GHz. Line 901 shows the measured electric field that is radiated from one embodiment of the proposed bypass capacitor implementation.

Figure 10:
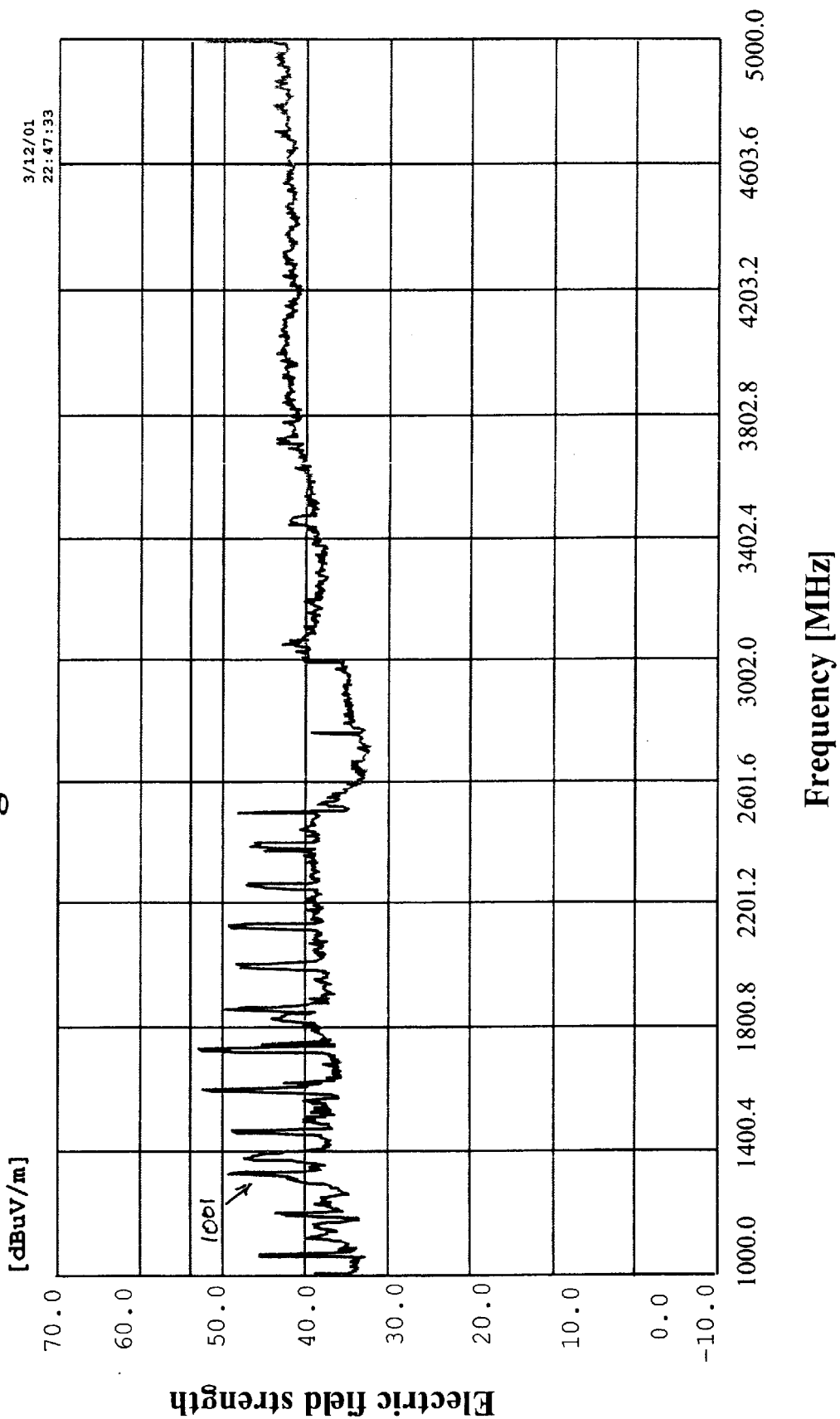
FIG. 10 is an electromagnetic interference scan showing a 360° connection to the PCI bracket.

FIG. 10 shows the electromagnetic radiation generated by a PCI board PCI plug-in card in a system with a connector with a 360° connection to the PCI bracket. The 360° connection is an implementation where the connector shell is connected in all directions to a ground. This implementation completely surrounds the connector shell with a low impedance path for common mode noise. The 360° connection provides adequate shielding, however it is also difficult to manufacture and it is very expensive. Line 1001 represents the electromagnetic radiation generated by the 360° connection. In this plot line 1001 shows electric field strength at approximately 1 GHz of about 33 decibels that gradually goes up to about 39 decibels at approximately 2.5 GHz.

Figure 11:
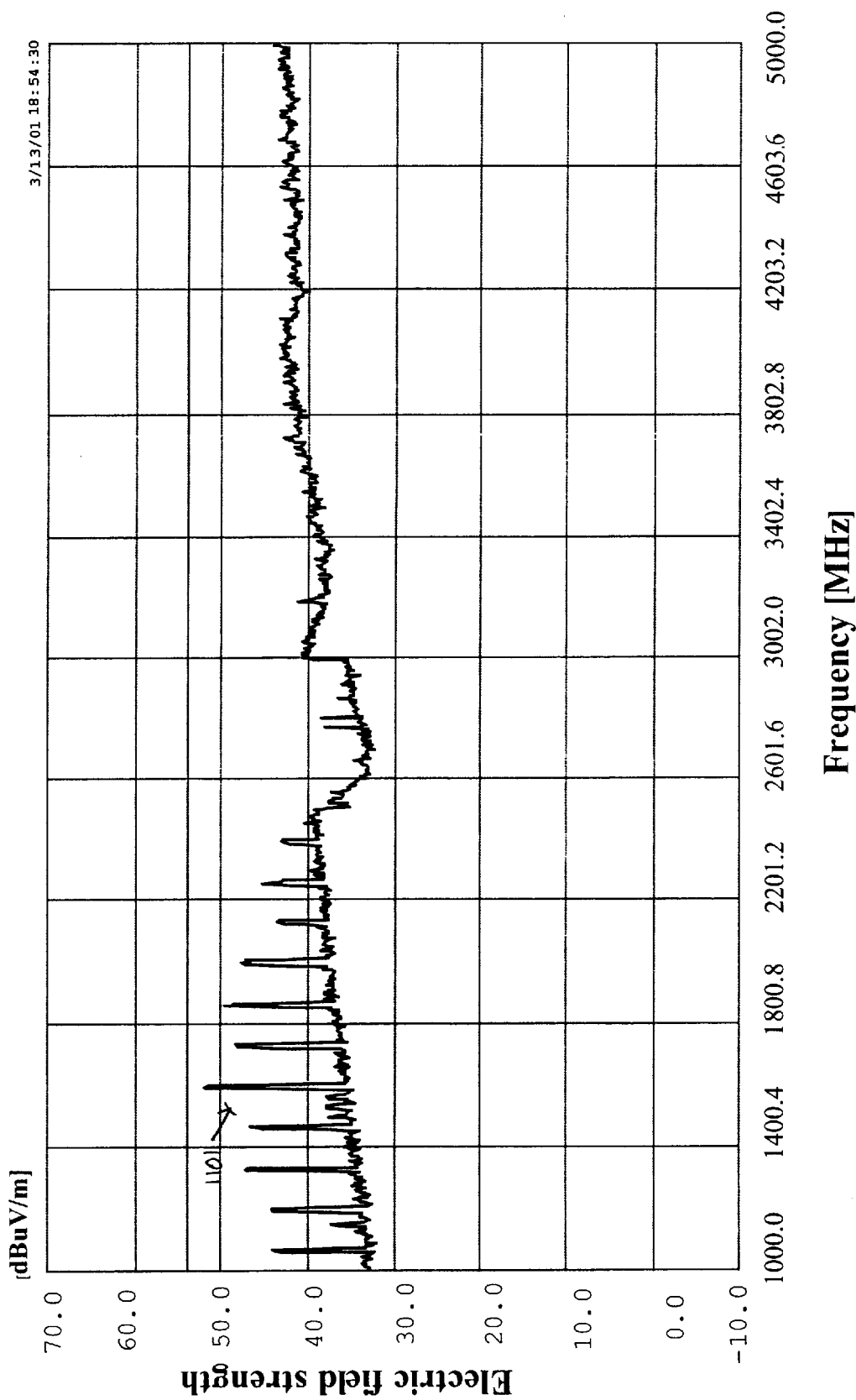
FIG. 11 is an electromagnetic interference scan demonstrating the absence of a PCI connection.

FIG. 11 is the electromagnetic interference spectrum in the 3-meter anechoic chamber for a system that does not have any PCI plug-in card. This measurement is called the baseline measurement, because it represents the measurable background level of electromagnetic radiation. That is, there is no source of electromagnetic radiation beyond background radiation in this measurement. In this plot, line 1101 is the baseline measurement. It can be seen in this measurement line 1101 goes from about 33 decibels at approximately 1 GHz to 39 or 40 decibels at approximately 2.5 GHz, the high end of the spectrum with which we are concerned.

Figure 12:
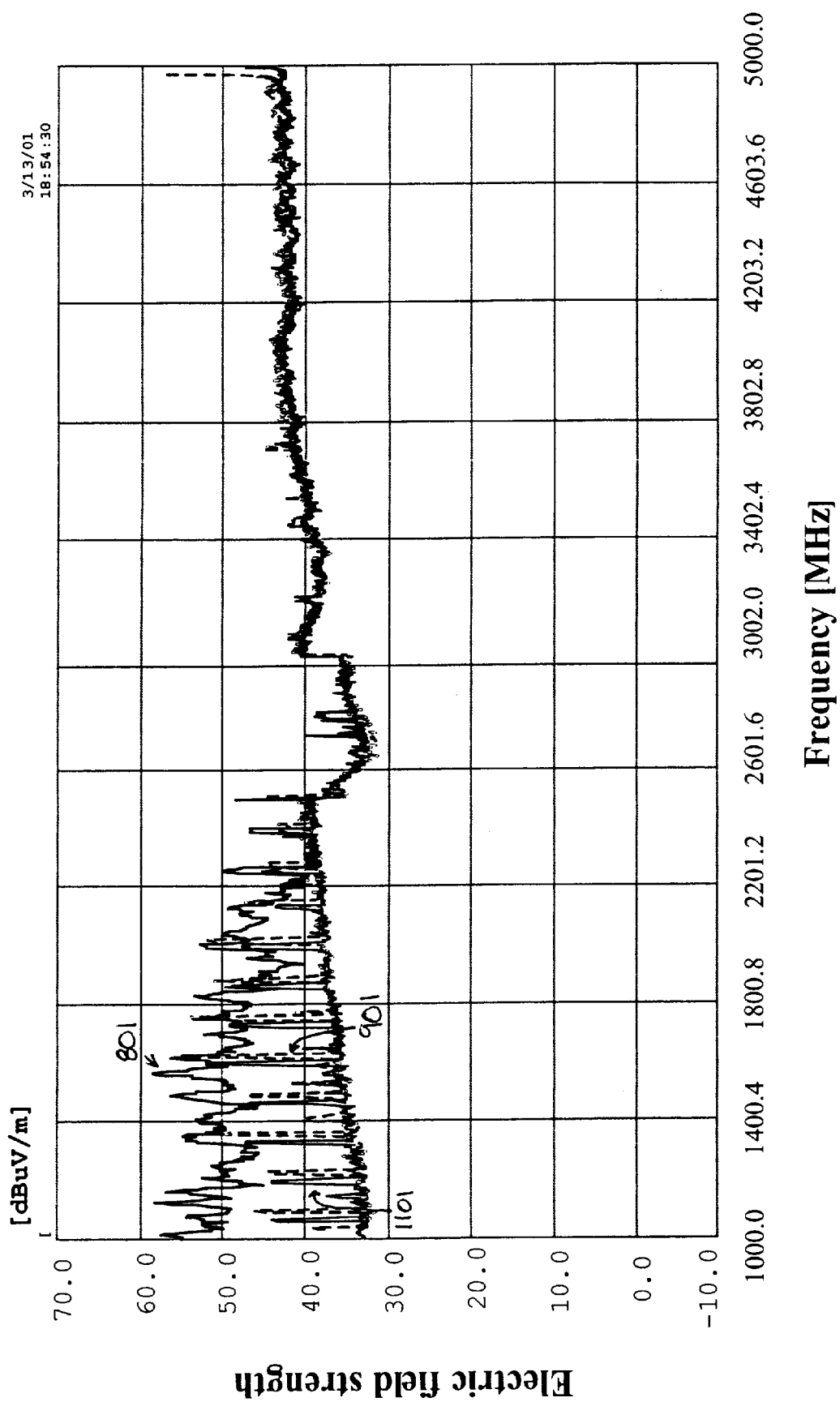
FIG. 12 is a comparative electromagnetic interference scan contrasting the connector shell floating and the proposed bypass capacitor implementation.

FIG. 12 is a comparative electromagnetic interference measurement result. The results compare the connector shell floating or the most electromagnetic interference generated by the card, and one embodiment of the proposed bypass capacitor technique. In this plot, line 1101 (solid) is the baseline without any plug card, or the least possible electromagnetic interference possible. Electromagnetic interference measurement line 801 (solid) is for the board with the connector shell floating, or the most electromagnetic interference radiation possible. Finally, line 901 (dashed) is the electromagnetic interference measurement of the board with one embodiment of the proposed bypass capacitor implementation. It can easily be seen from this figure that this embodiment of the proposed bypass capacitor implementation is a much better solution than having the connector shell floating. Leaving the connector shell floating is tantamount to doing nothing. It can also be seen from this figure that the embodiment of the proposed bypass capacitor implementation is very similar to not having the electromagnetic emission radiation in the frequencies of concern, i.e. approximately one GHz to 2.5 GHz. The results for this embodiment of the proposed bypass capacitor technique very closely mimic the results for no electromagnetic radiation, or the system baseline without a plug card.

Figure 13:
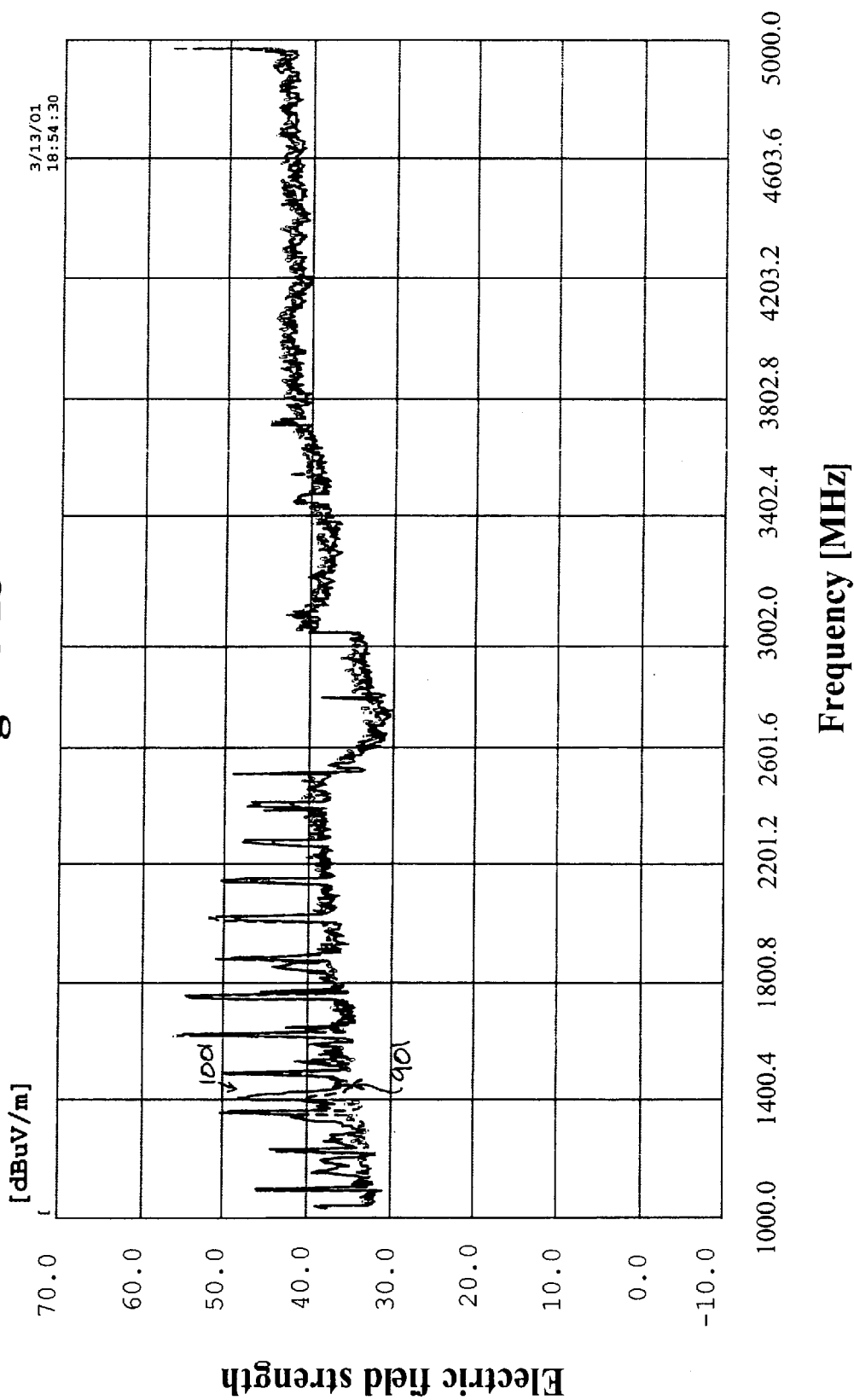
FIG. 13 is an electromagnetic interference scan comparing the proposed bypass capacitor implementation with the 360° connection to a PCI bracket.

FIG. 13 is a comparative analysis of the electromagnetic interference radiation results of one embodiment of the proposed bypass capacitor implementation and the board with connector with 360° connection to a PCI bracket. Line 901 (dashed) is the electromagnetic interference measurement of the board with one embodiment of the proposed bypass capacitor implementation. Line 1001 (solid) represents the electromagnetic radiation generated by the 360° connection. From this figure it can be seen that this embodiment of the proposed bypass capacitor implementation has an equal electromagnetic interference radiation to the 360° connection. The equivalence of the field strength of about 33 decibels at approximately 1 GHz to about 39 decibels at approximately 2.5 GHz demonstrates that this embodiment achieves the same results as the 360° enclosure, while the technique is much easier to fabricate in manufacturing and less costly.

In the preceding detailed description, the invention is described with reference to specific embodiments thereof. It will, however, be evident that various modifications and changes may be made thereto without departing from the broader spirit and scope of the invention as set forth in the claims. The specification and drawings, are accordingly, to be regarded in an illustrative rather than a restrictive sense.

What is claimed is:

1. An apparatus comprising:

A connector shell on a printed circuit board;

a plurality of connector pins coupled to the connector shell;

a metal plate in a signal metallization layer coupled to the plurality of connector pins; and a high frequency low impedance alternating current path having no substantial direct current capability coupled between the connector shell and a logic ground layer.

2. The apparatus of claim 1, wherein the high frequency low impedance alternating current path comprises a plurality of metal plates in a plurality of signal layers forming a plurality of capacitor plates in parallel coupled between the connector shell and a plurality of logic ground layers.

3. The apparatus of claim 2, wherein a size of a capacitor is such that a first resonance frequency of a structure is higher than a highest frequency of interest present in a data pattern.

4. The apparatus of claim 1, further comprising at least one discrete capacitor coupled to a top signal layer provide a low frequency low impedance alternating current path coupled between the connector shell and the logic ground layer.

5. The apparatus of claim 4, further comprising at least one discrete capacitor coupled to a second signal layer provide a low frequency low impedance alternating current path coupled between the connector shell and the logic ground layer.

6. The apparatus of claim 1, wherein the plurality of connector pins pass through a plurality of logic ground layers to make direct contact to a plurality of signal layers without providing a direct current path to the plurality of logic ground layers.

7. A method comprising:

providing a connector shell; and connecting a series of parallel printed circuit board capacitors to the connector shell, wherein said printed circuit hoard capacitors comprise a capacitor formed within a printed circuit board.

8. The method of claim 7, further comprising:

connecting a capacitor plate in a signal layer metallization directly to the connector shell; and providing a high frequency low impedance alternating current path to a logic ground layer.

9. The method of claim 8, further comprising:

connecting the signal layer capacitor plates directly to the connector shell with a plurality of connector pins that pass through a plurality of logic ground layers with out making a direct electrical contact to the logic ground.

10. The method of claim 8, further comprising dimensioning the capacitor plate such that a first resonance frequency of a structure is higher than a highest frequency of interest present in a data pattern.

11. The method of claim 7, further comprising:

connecting additional discrete capacitors to a signal metallization layer; and providing a low frequency low impedance alternating current path coupled between the connector shell and a logic ground layer.

12. The method of claim 11, further comprising:

connecting additional discrete capacitors to a bottom signal metallization layer.

13. A system comprising:

a printed circuit board;

a connector shell coupled to the printed circuit board;

a plurality of connector pins coupled to the connector shell;

a portion of a signal layer directly connected to the plurality of connector pins;

a high frequency low impedance alternating current path having no substantial direct current capability from the connector shell to a logic ground layer.

14. The system of claim 13 further comprising:

a plurality of signal layer capacitor pads directly connected to the plurality of connector pins providing a plurality of capacitors connected in parallel.

15. The system of claim 13 further comprising:

the portion of the signal layer directly connected to the plurality of connector pins being sized such that a first resonance frequency of a structure is higher than a highest frequency of interest in a data pattern.

16. The system of claim 13 further comprising:

at least one discrete capacitor coupled to a bottom signal layer to provide a low frequency low impedance alternating current path coupled between the connector shell and the logic ground layer.

17. The system of claim 16 further comprising:

at least one discrete capacitor coupled to a top signal layer to provide a low frequency low impedance alternating current path coupled between the connector shell and the logic ground layer.

* * * * *